United States Patent
Oi et al.

(10) Patent No.: US 6,815,774 B1
(45) Date of Patent: Nov. 9, 2004

(54) DIELECTRICALLY SEPARATED WAFER AND METHOD OF THE SAME

(75) Inventors: Hiroyuki Oi, Tokyo (JP); Kazuya Sato, Tokyo (JP); Hiroshi Shimamura, Tokyo (JP)

(73) Assignee: Mitsubishi Materials Silicon Corporation, Tokyo (JP)

( * ) Notice: Subject to any disclaimer, the term of this patent is extended or adjusted under 35 U.S.C. 154(b) by 0 days.

(21) Appl. No.: 09/421,322

(22) Filed: Oct. 18, 1999

(30) Foreign Application Priority Data

Oct. 29, 1998  (JP) .......................................... 10-307995
Dec. 17, 1998  (JP) .......................................... 10-359693
Dec. 24, 1998  (JP) .......................................... 10-367625

(51) Int. Cl.$^7$ ............................................. H01L 27/01
(52) U.S. Cl. ...................... 257/349; 257/347; 257/354; 438/404; 438/928
(58) Field of Search ................................ 257/347, 349, 257/352, 354; 438/404, 928, 929

(56) References Cited

U.S. PATENT DOCUMENTS

| | | | | |
|---|---|---|---|---|
| 4,807,012 A | * | 2/1989 | Beasom | ....................... 257/519 |
| 5,081,061 A | * | 1/1992 | Rouse et al. | ................. 438/404 |
| 5,246,877 A | * | 9/1993 | Hisamoto et al. | ............ 438/295 |
| 5,420,064 A | * | 5/1995 | Okonogi et al. | ............. 438/406 |
| 5,780,311 A | * | 7/1998 | Beasom et al. | .............. 438/406 |

FOREIGN PATENT DOCUMENTS

| | | | | |
|---|---|---|---|---|
| EP | 493116 | | 7/1992 | |
| EP | 0 493 116 A2 | | 7/1992 | |
| JP | 60-140732 | | 7/1985 | |
| JP | 61-120424 | | 6/1986 | |
| JP | 4-01-239866 | * | 9/1989 | ................. 438/404 |
| JP | 4-01-289124 | * | 11/1989 | ................. 438/404 |
| JP | 2-32563 | | 2/1990 | |
| JP | 2-52452 | | 2/1990 | |
| JP | 02-052452 | | 2/1990 | |
| JP | 03-153044 | | 7/1991 | |
| JP | 3-153044 | | 7/1991 | |
| JP | 5-283515 | | 10/1993 | |
| JP | 10-335447 | | 12/1998 | |

* cited by examiner

*Primary Examiner*—George Eckert
(74) *Attorney, Agent, or Firm*—Pillsbury Winthrop LLP

(57) ABSTRACT

A dielectrically separated wafer and a fabrication method of the same are provided according to the first, second and third embodiments of the present invention.

According to the first embodiment, it becomes possible to expand the device fabrication surface area of the dielectrically separated silicon islands by laminating a low concentration impurity layer including a dopant of the same conductivity on a high concentration impurity layer formed on the bottom of the island.

According to the second embodiment, a dielectrically separated wafer and a fabrication method for the same which can grow a polysilicon layer without producing voids in the dielectrically separating oxide layer is provided by forming a seed polysilicon layer at low temperature and under low pressure and by forming, on the seed polysilicon layer, a high temperature polysilicon layer 16.

According to the third embodiment, a dielectrically separated wafer and a fabrication method for the same is provided in which the surface between dielectrically separated islands is flattened by polishing the surface of the dielectrically separated wafer only the amount needed for the surface of a dielectrically separated wafer to become a flat surface between dielectrically separated silicon islands 10A, without projections or indentations.

4 Claims, 12 Drawing Sheets

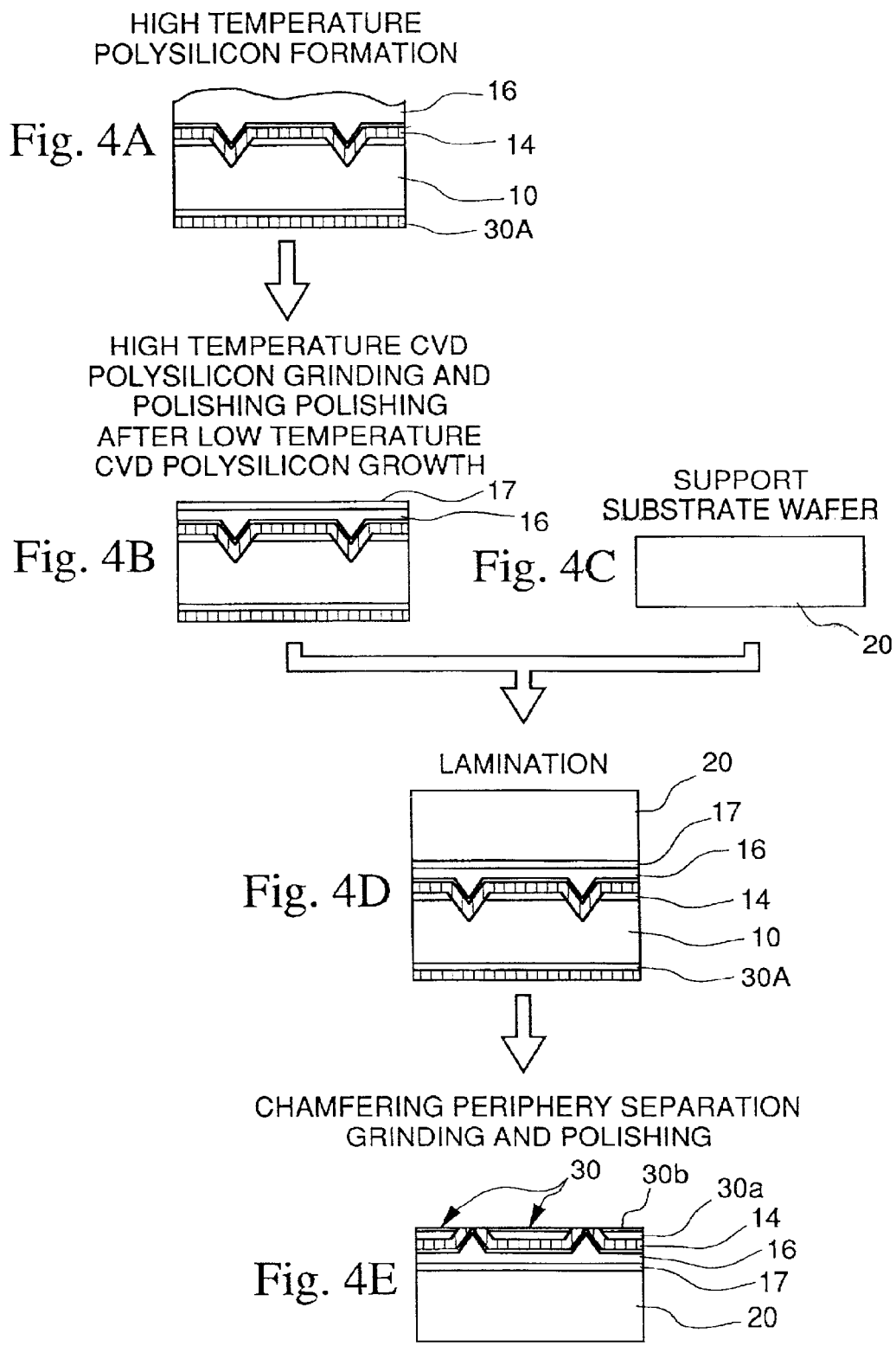

P-TYPE OR N-TYPE(100)

THROUGH OXIDE FILM FORMATION

ION IMPLANTING

STRIPPING THE OXIDE FILM FROM THE WHOLE SURFACE

MASK OXIDE FILM FORMATION

PR PROCESSING

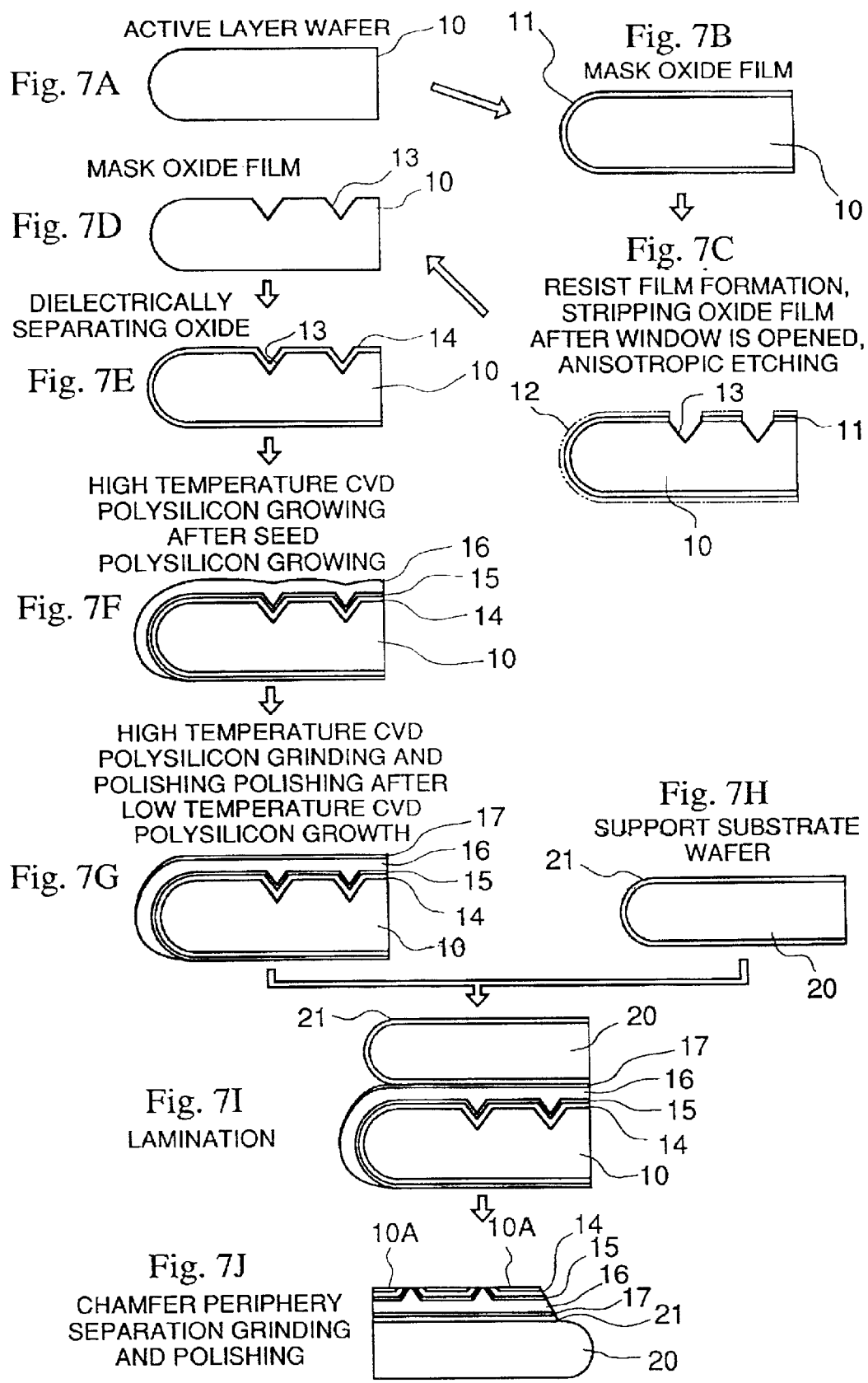

DIELECTRICALLY SEPARATED WAFER AND METHOD OF THE SAME

BACKGROUND OF THE INVENTION

1. Field of the Invention

The present invention relates to a dielectrically separated wafer and a fabrication method for the same, and particularly relates to a dielectrically separated wafer provided with dielectrically separated silicon islands having a N on N+ or a P on P+ structure with different dopants at different depths, to suppressing the growth of voids (gaps) when the polysilicon layer is grown on the surface of a dielectrically separating oxide film, and to flattening the surface between one dielectrically separated silicon island and another dielectrically separated island.

2. Description of the Related Art

A laminated dielectrically separated wafer is known as one type of laminated silicon wafer. The conventional laminated dielectrically separated wafer is fabricated by each of the processes shown in FIG. 15. FIG. 15 shows the cross-sectional structure of the dielectrically separated wafer fabricated by this method.

First, a silicon wafer is prepared whose active layer surface is mirror polished (FIG. 15(a)). Either an N-type or a P-type can be used. Next, a mask oxide film 11 is formed on the surface of this silicon wafer (FIG. 15(b)). Furthermore, a photoresist 12 is attached to the oxide film, and by photolithography windows are formed at specified locations. Additionally, the oxide film 11 exposed in these windows is eliminated, and windows having a specified pattern are formed on the oxide film. As a result, one part of the surface of the silicon wafer 10 is exposed. Next, after removing the photoresist 12, this silicon wafer 10 is immersed in an alkaline etchant, and the surface of the wafer undergoes anisotropic etching (FIG. 15(c)).

In this manner, dielectrically separating grooves 13 having a v-shaped cross-section are formed on the wafer surface.

Moreover, in this context, anisotropic etching is etching whose etching speed in the vertical direction is larger than the horizontal direction, and thus is directionally dependent due to the crystalline orientation of the silicon wafer 10.

Next, the mask oxide film 11 is cleaned and removed using a dilute HF solution (dilute hydrofluoride solution) or a buffer hydrofluoride solution (FIG. 15(d)). Subsequently, the dielectrically separating oxide film 14 of a specified thickness is formed on the silicon wafer surface, including the dielectrically separating grooves 13.

Next, the surface of this silicon wafer 10, that is, on the dielectrically separated oxide surface 14, a high temperature polysilicon layer 16 is grown to a specified thickness by the high temperature CVD method, at approximately 1200°~1300° C. (FIG. 6(f)). Next, the peripheral portion of the wafer is chamfered, and as necessary, the undersurface of the wafer is flattened. Next, the high temperature polysilicon layer 16 of the wafer surface is cut and polished to a thickness of approximately 10~80μ.

In addition, as necessary, subsequently a low temperature polysilicon layer 17 having a thickness of 1~5μ is formed on the wafer surface by the lower temperature CVD method at approximately 550~700° C., and the surface of the low temperature polysilicon layer 17 is polished in order to produce a mirror surface on the laminated surface.

In contrast, a silicon wafer 20 that serves as the support substrate wafer is prepared separately (FIG. 15(h)). The surface of this wafer is mirror polished. Next, the mirror surface of the silicon wafer 10 is brought into contact with and laminated on the mirror surface of the silicon wafer 20 (FIG. 15(i)).

Subsequently, a specified annealing is carried out in order to increase the lamination strength of these laminated wafers.

Next, as shown in FIG. 6(j), the peripheral portion of the active surface wafer of these laminated wafers is chamfered. In addition, the laminated wafer having the active surface is ground and polished. The amount of grinding of this active surface wafer exposes to the outside a part of the dielectrically separating oxide film 14, and on the surface of the high temperature polysilicon surface 16, dielectrically separated silicon islands 30 defined by the dielectrically separating oxide film 14 are realized.

Three problems are encountered in the conventional dielectrically separated wafers. The first problem is related to the restricted surface area for manufacturing the semiconductor device on the dielectric separated wafer; the second problem is related to a void (gap) B, which is an air bubble defect, will develop between the neighboring polysilicon cores; and the third problem is related to the surface steps caused by the differences of the grinding speed of the constituting layers. These three problems will be described hereinafter.

The first problem will be described. In recent years, the power IC for a large electric current has been developed. In the power IC, a dielectrically separated structure wherein each element is completely separated by a dielectrically separating oxide film has been adopted. In these elements, in order to sustain well the falling voltage of the PN junction, it is necessary to make the specific resistance of the dielectrically separated silicon islands very high.

However, a high specific resistance limits the voltage of the elements during operation, incurring the disadvantage of increasing what is termed the operational resistance.

Thus, generally, between the dielectrically separated silicon islands and the dielectrically separating oxide film a high concentration impurity layer (N+ region and P+ region) is provided in which impurities are diffused in high concentration. This high concentration impurity layer serves as the path for the current and reduces the increase in operational resistance.

In this type of dielectrically separated wafer, conventionally, as shown in FIG. 16, the high concentration impurity layer 30a is formed along the dielectrically separating oxide film 14 having a saucer shape, and on the inside of this high concentration impurity layer 30a a low concentration impurity layer 30b is defined.

In order to fabricate this dielectrically separated wafer, first the surface of a silicon wafer having a low concentration of impurities (dopants) undergoes anisotropic etching, and dielectrically separating grooves are formed. Subsequently, over the entire surface of the silicon wafer on which the dielectrically separating grooves have been formed, a high concentration impurity layer 30a is formed at a specified depth by thermally diffusing or ion implanting a dopant having the same conductivity. Subsequently, the dielectrically separating oxide film 14, etc., are formed, and further, as described above, by grinding and polishing the undersurface of the wafer, dielectrically separated silicon islands 30 having a N on N+ structure or a P on P+ structure are realized on the wafer surface.

However, because the high concentration impurity layer of the dielectrically separated wafer according to this type of conventional technology has a saucer shaped surface cross-section, like the dielectrically separating oxide film, the peripheral portion of the surface of the dielectrically separated silicon islands is structured by a high concentration impurity layer.

As a result, first problems arise that it is necessary to manufacture a device avoiding the regions of this exposed high concentration impurity layer, and the fabrication surface area of the device at the dielectrically separated silicon islands becomes small.

Next, the second problem will be described. As described before, the conventional laminated dielectrically separated wafer is fabricated by each of the processes shown in FIG. 15. However, according to the conventional fabrication method of the dielectrically separated wafer, during the growth period of the polysilicon layer 16 by the high temperature CVD method, as shown in FIG. 6, in the case that there exists a particle P, a defect, etc., on the surface of the dielectrically separating oxide film 14, the polysilicon slowly develops these as growth nuclei.

As a result, among the groups many groups of polysilicon cores 16a that grow the particles, etc., as growth nuclei, there is the concern that a void (gap) B, which is an air bubble defect, will develop between the neighboring polysilicon core 16a and polysilicon core 16a.

Therefore, as subsequent steps are completed, in the case that this void B is exposed on the surface of the dielectrically separated wafer, this part becomes a concavity, and there is the inconvenience that contaminants will remain therein. In addition, even in the case that this void B is not exposed on the surface of the dielectrically separated wafer, there is the concern that in the device fabrication process on the user side, this void B might cause thermal deterioration of the dielectrically separated wafer.

The third problem will be described next. According to the above-described type of conventional dielectrically separated wafer fabrication method, in the finishing process of the laminated dielectrically separated wafer, the surface of the wafer 10 having the active layer is ground, and using an alkaline abrasive, this ground surface is polished until the dielectrically separated silicon islands 10A, which are insulated by a dielectrically separating oxide film 14, appear.

FIG. 12 is a drawing showing the relationship between the amount of polishing of the surface of the dielectrically separated wafer and the distance between neighboring dielectrically separated silicon islands. FIG. 13 is an enlarged cross-sectional diagram of the necessary components of the dielectrically separated wafer fabricated by minimizing the amount of polishing according to conventional means. FIG. 14 is an enlarged cross-sectional diagram of the necessary components of the dielectrically separated wafer fabricated by maximizing the amount of polishing according to conventional means.

In FIG. 12, D is the total depth (about 70 $\mu$m) of dielectrically separating grooves, L1 is the amount of polishing of the dielectrically separating silicon island 10A, L2 is the amount remaining after polishing the dielectrically separated silicon island 10A, and W is the distance between one dielectrically separated silicon island 10A and another dielectrically separated silicon island 10A. The angle $\theta$ of the side walls of the dielectrically separated grooves is 54.7°.

As shown in FIG. 14, because the bottom portion of the dielectrically insulating grooves 13 of the active surface wafer 10 are polished when the surface is polished, the larger the amount of polishing L1 becomes, the longer the distance W between the dielectrically separated islands 10A becomes. Contrarily, the smaller the amount of grinding L1, the shorter distance W becomes.

In this connection, when actually trying to polish the surface of the active layer wafer 10, it became apparent that the cross-sectional form of the surface of the high temperature polysilicon layer 16 that is exposed between the dielectrically separated islands 10A varies.

That is, when the amount of polishing L1 is small, at about, for example, 10 $\mu$m, the distance W became narrow, and its exposed portion, that is, along the V-shaped groove of the dielectrically separated oxide film 14, grew, and then at the border to the high temperature polysilicon layer 16, a projection 16b developed (refer to FIG. 4). In addition, when the amount of polishing L1 is increased to, for example, 25 $\mu$m, the distance W becomes long, and an indentation 16a develops along this edge (refer to FIG. 5).

Generally, if the amount of polishing L1 is made decreased, it is preferable that the surface area of the dielectrically separated silicon islands 10A upon which devices can be manufactured be enlarged by that amount. However, on the one hand, making the amount of polishing L1 small produces projections 16b of approximately 0.3 $\mu$m, which is the absolute value of the difference between the maximum value and the minimum value when measured by a stylus-profilometer. Consequently, for example, during the contact exposure of the device fabrication process, the mask (not shown in the figures) that covers the wafer surface can be damaged, and the resist in the vicinity of the projection 16b can easily remain. Thus, problems such as defective patterns, insufficient resolution, separation of the mask, etc., are easily incurred.

On the other hand, if the amount of polishing L1 is made large, on the surface of the active layer wafer 10, an indentation 16a is produced due to the difference in polishing speed of the various layers 10A, 14, and 16 that form this surface. In particular, at the above-mentioned border, compared to the dielectrically separated silicon islands 10A and the dielectrically separating oxide film 14, the speed of the progress of the etching becomes fast and produces indentations 16a of approximately 0.3 $\mu$m, which is the absolute value of the difference between the maximum value and the minimum value when measuring with a stylus-profilometer.

If this type of deep steps are formed after shipping the product, when the user fabricates devices in the photolithography process, for example, this interferes with applying the resist uniformly to the wafer surface, and this incurs the problems of disconnected circuits and deterioration of resolution. Furthermore, when removing the resist film after exposure, a part of the film may remain on the surface of the wafer. In addition, in other processes as well, the indentation 16a becomes a site that absorbs contaminants. Furthermore, there is the problem that normally the contaminants absorbed by the indentation 16a cannot easily be eliminated because the width of the indentation 16a is narrow.

SUMMARY OF THE INVENTION

An object of the first embodiment of this invention is to solve the first problem by providing a dielectrically separated wafer that can expand the device fabrication area on the dielectrically separated silicon islands. The object of the first embodiment also includes to provide a fabrication method for a dielectrically separated wafer that can expand the device fabrication surface area.

In a first aspect of the first embodiment of the present invention, in a dielectrically separated wafer having a plurality of dielectrically separated silicon islands mutually defined by a dielectrically separating oxide film, these dielectrically separated silicon islands have a high concentration impurity layer formed at the bottom of the islands and a low concentration impurity layer having an identical conductivity laminated on the high concentration impurity layer.

In a method wherein dielectrically separated silicon islands have a N on N+ structure or a P on P+ structure, as shown in the second aspect of the first embodiment of the invention, a method is presented in which dopants of identical conductivity are given a differential concentration by thermal diffusion or ion implantation.

It is also possible that the dielectrically separated wafer be a laminated wafer wherein a support substrate wafer is laminated on the undersurface of a dielectrically separated wafer having a thinned polysilicon layer.

The thickness of the high concentration impurity layer is, for example, $1 \sim 10\mu$, but can be decided according to convenience depending on the device to be fabricated.

A second aspect of the first embodiment of the present invention is a dielectrically separated wafer fabrication method including a step of forming a high concentration impurity layer including at a high concentration impurities of identical conductivity at a specified depth range below the surface of the silicon wafer and a low concentration impurity layer including at low concentrations impurities of identical conductivity at a specified depth range from this high concentration impurity layer; a step of forming a dielectrically separating groove deeper than the above high concentration impurity layer on the surface of this silicon wafer; a step of forming a dielectrically separated oxide film on this dielectrically separating groove and on each surface of the of the silicon wafer; a step of laminating a polysilicon layer on this dielectrically separated oxide film; and a step of grinding and polishing the silicon wafer from the undersurface and realizing a plurality of dielectrically separated silicon islands separated by this dielectrically separating oxide film on this polished surface, and wherein this high concentration impurity layer is formed on the bottom of these dielectrically separated silicon islands and the low concentration impurity layer is formed on this high concentration impurity layer.

As a method for growing the polysilicon layer, it is possible to use the high temperature CVD method. In this method, a material gas including silicon is introduced into a reactive furnace along with a carrier gas ($H_2$ gas, etc.), and precipitate silicon is grown by thermal decomposition or reduction of the atomic gas on the silicon wafer which has been heated to a high temperature. Normally, $SiCl_4$, $DiHCl_3$, etc., are used as compounds that include silicon.

In the reaction furnace, in a dome shaped quartz bell jar, there is also a pancake type furnace wherein the gas is introduced, and heated by high frequency induction while rotating a susceptor on which the silicone wafer is mounted. In addition to this, the silicon wafer is laminated to each surface of a six-sided columnar susceptor accommodated inside the quartz container, and subsequently, it is possible to use, for example, a cylinder (barrel) type furnace wherein this susceptor is rotated while being heated by gas introduced or an infrared lamp.

The temperature for growing the polysilicon differs depending on the heating method of the furnace. In the most widely used pancake furnace applied for this use, $1200°\sim1290°$ C. is preferable, and $1230°\sim1280°$ C. is more preferable. Below $1200°$ C., the inconvenience in incurred that the silicon wafer is easily cracked, and above $1290°$ C.,
the inconvenience is incurred that slips are produced, and the silicon wafer can become cracked.

For a thickness 2 or 3 times the thickness obtained by anisotropic etching, the thickness of the polysilicon layer is the thickness to which the thickness of the polysilicon layer to be left is added. At double or less the thickness of the polysilicon layer that is produced by anisotropic etching, the grooves made by anisotropic etching may not be sufficiently covered. On the other hand, at three times or greater, it may be unnecessarily thickly deposited.

For the anisotropic etchant, it is possible to use alkaline etchants such as KOH ($IPA/KOH/H_2O$), KOH ($KOH H_2O$), KOH (hydrazine/$KOH/H_2O$). The normal conditions for anisotropic etching can be adopted.

In addition, it is possible to use generally adopted conditions for each step in forming the windows of the isotropic etching on the negative resist film on the surface of the wafer.

It is possible to use well-known methods of thermal diffusion that thermally diffuse dopants of a specified conductive type (N-type or P-type). That is, using a thermal diffusion furnace, while feeding gases such as $PH_3$, $Sb_2O_3$, and $BBr_3$, the furnace temperature is maintained in an appropriate range, $600\sim1250°$ C.

Concretely, for example, an N-type dopant, such as phosphorus, or P-type dopant, such as boron, that have the same conductivity as the wafer, is thermally diffused over the surface of a silicon wafer that has incorporated a low concentration dopant over its entirety. Thereby, a lamination having an N on N+ structure or a P on P+ structure is formed within the region of the silicon island formations.

In addition, ion implantation can also be used. That is, using an ion implantation apparatus, the dopant (impurity) of the same conductivity is gasified and ionized, accelerated by an electrical field, and driven into the silicon wafer surface.

Dopant can be incorporated into the silicon wafer before forming the dielectrically separating grooves by anisotropic etching. For example, before the step of applying the mask oxide film (or a nitride film) to the silicon wafer.

Furthermore, the depth of the dielectrically separating grooves formed on the silicon wafer surface must be deeper than the high concentration impurity layer, and as deep as the low concentration impurity layer.

The object of the second embodiment of this invention is to provide a dielectrically separated wafer that does not have exposed concavities in the polysilicon layer surface and eliminates voids from the interface between the polysilicon layer and the dielectrically separating oxide layer.

In addition, another object of the second embodiment of this invention is to provide a fabrication method for a dielectrically separated wafer in which there is no development of voids at the interface between the dielectrically separating oxide film and the polysilicon layer.

A first aspect of the present invention is a dielectrically separated wafer having a polysilicon layer and a plurality of silicon islands mutually insulated by the dielectrically insulating oxide film formed on the surface of this polysilicon layer, and wherein this polysilicon layer has a seed polysilicon layer that is grown by a low temperature CVD method on the interface with the dielectrically insulating oxide film.

In addition to having a support substrate with a thickened polysilicon layer, the dielectrically separated wafer can have a supporting substrate laminated on the undersurface of the dielectrically separated wafer that has a thinned polysilicon layer.

A second aspect of the present invention is a fabrication method for a dielectrically separated wafer wherein dielectrically separating grooves are formed on the surface of the silicon wafer, a dielectrically separating oxide film is formed on the surface of the silicon wafer including the surface of these dielectrically separating grooves, a polysilicon layer is formed on the surface of this dielectrically separating oxide film, this polysilicon wafer is ground and polished from this underside, and a plurality of dielectrically separated silicon islands separated by the dielectrically separating oxide film on this polished surface are realized, and wherein a seed polysilicon layer is grown by low temperature the CVD method on the surface of this dielectrically separating oxide film, and subsequently a polysilicon layer is grown using the high temperature CVD method on the surface of this seed polysilicon layer.

As a method for growing the polysilicon layer, it is possible to use the high temperature CVD method. In this method, a material gas including silicon is introduced into a reactive furnace along with a carrier gas ($H_2$ gas, etc.), and precipitate silicon is grown by thermal decomposition or reduction of the atomic gas on the silicon wafer which has been heated to a high temperature. Normally, $SiCl_4$, $DiHCl_3$, etc., are used as compounds that include silicon.

In the reaction furnace, in a dome shaped quartz bell jar, there is also a pancake type furnace wherein the gas is introduced, and heated by high frequency induction while rotating a susceptor on which the silicone wafer is mounted. In addition to this, the silicon wafer is laminated to each surface of a six-sided columnar susceptor accommodated inside the quartz container, and subsequently, it is possible to use, for example, a cylinder (barrel) type furnace wherein this susceptor is rotated while being heated by gas introduced or an infrared lamp.

The temperature for growing the polysilicon differs depending on the heating method of the furnace. In the most widely used pancake furnace applied for this use, 1200°~1290° C. is preferable, and 1230°~1280° C. is more preferable. Below 1200° C., the inconvenience in incurred that the silicon wafer is easily cracked, and above 1290° C., the inconvenience is incurred that slips are produced, and the silicon wafer can become cracked.

For a thickness 2 or 3 times the thickness obtained by anisotropic etching, the thickness of the polysilicon layer is the thickness to which the thickness of the polysilicon layer to be left is added. At double or less the thickness of the polysilicon layer that is produced by anisotropic etching, the grooves made by anisotropic etching may not be sufficiently covered. On the other hand, at three times or greater, it may be unnecessarily thickly deposited.

As a method of growing the seed polysilicon layer, a low temperature CVD method at atmospheric pressure or reduced pressure is used. In this method, like the high temperature CVD method, a material gas including silicon is introduced into a reactive furnace along with a carrier gas ($H_2$ gas, etc.), and precipitate silicon is grown by thermal decomposition or reduction of the atomic gas on the silicon wafer which has been heated to a high temperature. Normally, $SiCl_4$, $DiHCl_3$, etc., are used as the compounds that include silicon. In the reaction furnace, in a dome shaped quartz bell jar, there is also a pancake type furnace wherein the gas is introduced, and heated by high frequency induction while rotating a susceptor on which the silicone wafer is mounted. A horizontal reaction furnace resistance heated from the outside of the quartz bell jar or a vertical reaction furnace in which a quartz tube is laid horizontally, a boat in which the silicon wafer is laid is accommodated within the tube, and resistance heating is applied form outside the tube while the gas is introduced The growth temperature of the seed polysilicon is preferably 540°~670° C., more preferably 570°~650° C. Below 540° C., the inconvenience in incurred that the reaction is slow, while in contrast, when above 670° C., the inconvenience is incurred that the crystal particles become too large.

The pressure during the growth of the seed polysilicon layer is preferably 10 Ps ~ atmospheric pressure, and more preferably 30 Pa ~ atmospheric pressure. Below 10 Ps, the inconvenience is incurred that the growth is slow, while when above atmospheric pressure, the distribution of the thickness deteriorates.

The thickness of the seed polysilicon layer is preferably 50~5000 nm, and more preferably 100~3000 nm. Below 50 nm, there is the concern that when laminating the high temperature polysilicon surface, due to the etching action of the polysilicon, parts of this seed polysilicon layer are dissipated, and holes may be produced. Above 5000 nm, the inconvenience is incurred that it becomes unnecessarily thick.

For the anisotropic etchant, it is possible to use alkaline etchants such as KOH ($IPA/KOH/H_2O$), KOH ($KOH\ H_2O$), KOH ($hydrazine/KOH/H_2O$). The normal conditions for anisotropic etching can be adopted.

In addition, it is possible to use generally adopted conditions for each step in forming the windows of the isotropic etching on the negative resist film on the surface of the wafer.

According to this invention, a relatively thin seed polysilicon layer is grown on the surface of a dielectrically separating oxide film by the low temperature CVD method, and subsequently, a polysilicon layer is grown on the surface of this seed polysilicon layer by the high temperature CVD method.

The particle diameter of the crystals is smaller when the polysilicon is grown by the low temperature CVD method compared to the growth by the high temperature CVD method. As a result, even if there are particles or defects on the surface of the dielectrically separating oxide film, these will gradually be covered by the seed polysilicon, which has good coating characteristics. Therefore, the smoothness of the surface of the seed polysilicon layer is increased.

Thus, subsequently, when polysilicon is grown by the high temperature CVD method on this very flat surface, a growth occurs that is different from the growth of large polysilicon cores of the conventional means. That is, over the entire surface of this dielectrically separating oxide film, the polysilicon grows at an approximately uniform thickness. Thereby, it is possible to decrease the voids that develop between the dielectrically separating oxide film and the polysilicon layer.

Thereby, it is possible to eliminate concavities in the polysilicon layer surface exposed on the dielectrically separated wafer surface and the voids, and to eliminate gaps from the interface between the polysilicon layer and the dielectrically separating oxide film in the dielectrically separated wafer.

An object of the third embodiment of the present invention is solve the third problems by providing a dielectrically separated wafer and a fabrication method for the same that can flatten the surface between dielectrically separated silicon islands of a dielectrically separated wafer.

The third embodiment provides a dielectrically separated wafer and a fabrication method for the same that allows simultaneous implementation of the realization of dielectrically separated silicon islands having a comparably large surface area relative to the wafer surface, the prevention of damage to the mask in the contact exposure process, the prevention of contaminants adhering between dielectrically separated silicon islands, the realization of uniform application of the resist to the wafer surface, and prevention of resist film form remaining of the wafer surface.

A first aspect of the third embodiment of the present invention is a dielectrically separated wafer having a plurality of dielectrically separated silicon islands insulated by a dielectrically separating oxide film on the wafer surface, wherein the surface between one dielectrically separated silicon island and another neighboring dielectrically separated silicon island is formed so as to be flat.

Normally, the dielectrically separated silicon island is formed using a polysilicon layer as a base. This polysilicon layer is formed by the CVD method. In the CVD method, a source gas (material gas) including silicon is introduced into a reaction furnace along with a diluting gas (normally, $N_2$ gas), and silicon generated by thermal decomposition or reduction of the material gas is deposited on a silicon wafer heated to a high temperature. Compounds that incorporate silicon include, for example, trichlorosilane ($SiHCl_3$), silicon tetrachloride ($SiCl_4$), as well as, for example, monosilane ($SiH_4$) and dichlorosilane ($SiH_2Cl_2$). In addition, the CVD method includes, for example, the high temperature CVD method at 1200~1300° C. and the low temperature CVD method at 550~700° C.

Reaction furnaces include, for example, the pancake shaped furnace that induction heats a silicon wafer on a boat fixed in a lateral quartz tube while gas is being feed. In addition, there is the vertical shaped furnace that resistance heats a vertical quarts (SiC) boat upon which the silicon wafer is placed while rotating it and feeding gas.

Here, the flattening of the surface between the dielectrically separated silicon islands means that, when using a stylus-type step measurer, the absolute value we the difference between the largest measured value and the smallest measured value is less than 0.2 µm. However, if the amount of polishing of the surface of the dielectrically separated wafer can flatten the wafer surface between dielectrically separated silicon islands, it is not particularly limited. Moreover, the amount of polishing necessary for this flattening differs depending on such polishing conditions as the corrosion resistance of the polysilicon layer and the thickness of the dielectrically separating insulating film.

A second aspect of the third embodiment is a dielectrically separated silicon wafer for which the flatness of the surface between these dielectrically separated silicon islands is less than 0.2 µm, which is the absolute value of the difference between the maximum value and the minimum value when this surface is measured by a stylus-profilometer.

When the absolute value of the difference exceeds 0.2 µm, such inconveniences are incurred as unevenness of the surface, damage to the mask during contact exposure, resist adhesion, blurred resolution, resist remaining, and contamination. This falls under a fourth aspect of the present invention.

A third aspect of the third embodiment is a fabrication method for a dielectrically separated wafer including the steps of forming dielectrically separating grooves by anisotropic etching on the silicon wafer surface, coating a dielectrically separating insulating film on the surface of a silicon wafer including these dielectrically separating grooves, depositing a polysilicon layer by the high temperature CVD method on this dielectrically separating insulating film, and providing a plurality of dielectrically separated silicon islands insulated by a dielectrically separating insulating film by separation polishing the silicon surface of the side of the silicon wafer opposite to the side on which the polysilicon layer is deposited, and wherein depending on the corrosion resistance of this deposited polysilicon layer, the thickness of this dielectrically separating insulating film, the etching depth for forming these dielectrically separating grooves, and the distance between neighboring dielectrically separated silicon islands, the surface between one dielectrically separated silicon island and a neighboring dielectrically separated silicon island is flattened by changing the conditions of the separation polishing of the silicon surface.

Here, the corrosive resistance of the polysilicon layer relates to the type of source gas, the distinction between high temperature CVD method and low temperature CVD method, and the particle diameter and speed of growth of this polysilicon layer.

In addition, the thickness of the dielectrically separating insulating film is determined by the required pressure resistance of the devices. The typical thickness is 0.7~3.0 µm. Under 0.7 µm, it meets few requirements as a high pressure resistant substrate. In addition, when exceeding 3.0 µm, the problems of worsening fabrication characteristics and serious warping are incurred. In addition, dislocated pits are easily produced.

Furthermore, the etching depth for forming the dielectrically separating grooves is determined depending on pressure resistance requirements of the elements to be produced, and for light elements, the attenuation depth of the light. This depth would be, for example, 10~70 µm.

The distance between neighboring dielectrically separated silicon islands is determined by the chip size and requirements of the circuit structure, along with the precision of the processing, and is, for example, 0~40 µm. The 0 µm distance is the case that the silicon islands are only insulted from each other by a separation oxide film.

Examples of the conditions for the separation polishing of the silicon surface are the conditions of the abrasive used to polish the surface of the dielectrically separated wafer. As an abrasive, it is possible to use, for example, an alkaline etchant adding to 2~5 wt. % an abrasive grain with average particle diameters of about 20~100 nm. Preferably, the abrasive has a pH of 9~11.

As a method for forming the polysilicon layer, for example, the reduced pressure CVD method and the atmospheric pressure CVD method are used. The pressure while growing the film by the reduced pressure CVD method is about 10~80 Pa.

A fourth aspect of the third embodiment is a dielectrically separated wafer whose surface smoothness between dielectrically separated silicon islands is less than 0.2 µm, which is the absolute value of the difference between the maximum value and the minimum value when this surface is measured by a stylus-profilometer.

According to this invention, the surface of the dielectrically separated wafer is polished only to the degree necessary to become a smooth surface without protrusions or indentations between one dielectrically separated island and another dielectrically separated island.

As a result, it is possible to realize dielectrically separated islands that have a relatively large surface area with respect to the wafer surface area. Furthermore, at the same time, this allows preventing damage to the resist film during the contact exposure process in device fabrication, preventing contamination from adhering between the dielectrically insulated islands, realizing a uniformly applied resist film on the wafer surface, and the prevention of this film from remaining on the wafer surface during the resist film stripping.

In particular, in the second and fourth aspects of the invention, the smoothness of the surface between dielectrically separated silicon islands is less than 0.2 μm, which is the absolute value of the difference between the maximum value and the minimum value when measured by a stylus-profilometer.

In addition, in the third aspect of the invention, the conditions of the separation polishing of the silicon surface and the flattening of the surface between the dielectrically separated islands depend on the corrosion resistance of the polysilicon layer, thickness of the dielectrically separating insulating film, the depth of etching, and the distance between neighboring dielectrically separated silicon islands.

BRIEF DESCRIPTION OF THE DRAWINGS

FIGS. 4A to 4E are cross-sectional drawings for explaining a part of the fabrication process of the dielectrically separated wafer according to the first embodiment of this invention.

FIGS. 7A to 7J are explanatory drawings showing the fabrication process of the dielectrically separated wafer according to the embodiment of the present invention.

DETAILED DESCRIPTION OF THE INVENTION

First Embodiment

Figure 1:
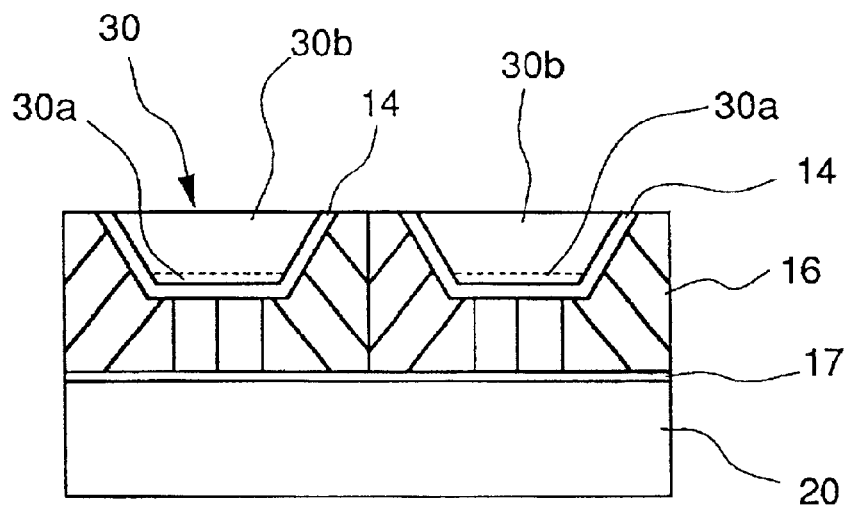
FIG. 1 is a cross-sectional drawing showing the dielectrically separated wafer according to the first embodiment of the invention.

Below, the dielectrically separated wafer according to the first embodiments of the present invention and a manufacturing process for the same will be explained. Moreover, here, the laminated dielectrically separated wafer explained in the Description of the Related Art will be explained as an example. Therefore, the same parts are denoted by the same reference numerals.

In FIG. 1 is a cross-sectional enlargement of the necessary elements of the dielectrically separated wafer according to the first embodiment of the present invention. FIG. 2 through FIG. 4 are cross-sectional figures for explaining the fabrication steps of the dielectrically separated wafer according to the first embodiment of the present invention.

Figure 2A:
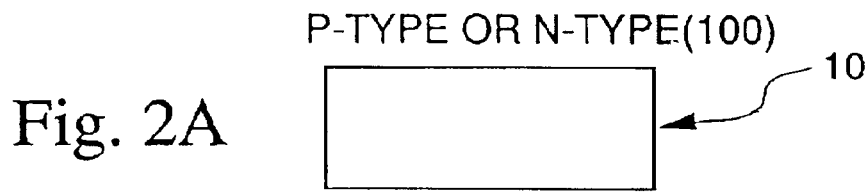
FIGS. 2A to 2F are cross-sectional drawings for explaining a part of the fabrication process of the dielectrically separated wafer according to the first embodiment of this invention.
Figure 2B:
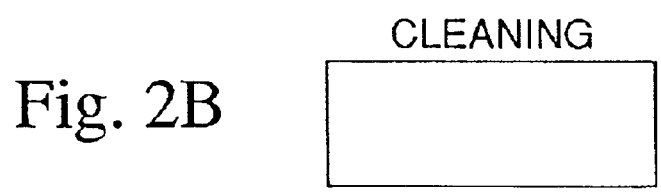
Figure 2C:
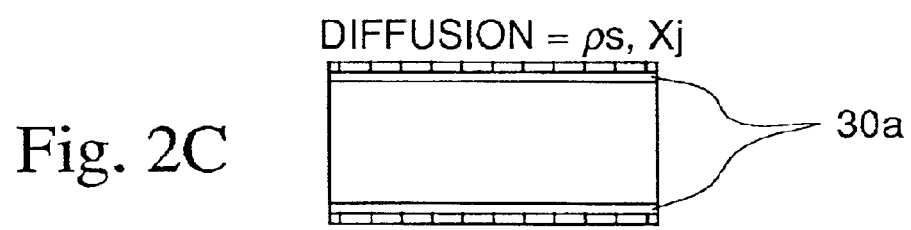

First, a silicon wafer 10 having the surface that will serve as the active surface of the wafer is fabricated and prepared (FIG. 2(A)). The surface orientation denoted by 100. Moreover, the whole silicon wafer 10 is doped with a low concentration of phosphorus. Of course, a P-type wafer can also be used. Additionally, this silicon wafer 10 is cleaned (FIG. 2(B)).

Next, this silicon wafer is inserted into a thermal diffusion furnace, and while a gas (PH3) is feed, the temperature in the furnace is increased to 600°~1200° C. Thereby, phosphorus is thermally diffused to a specified depth below the surface of the silicon wafer 10, and this surface part becomes the phosphorus rich ($N^+$-type) high concentration impurity layer 30a (FIG. 2(C)). The depth (Xj) of this high concentration impurity layer is 1~5 μm. In addition, the specific resistance (ρs) is 5~20Ω/. Moreover, the thermal oxidation film ($SiO_x$) of a specific thickness is formed on the surface of this high concentration impurity layer 30a.

Figure 2D:
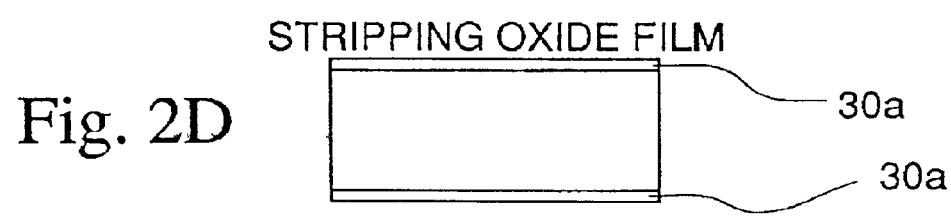

Next, this silicon wafer 10 is cleaned by a dilute HF solution, and the thermal oxide film is eliminated (FIG. 2(D)).

Figure 2E:
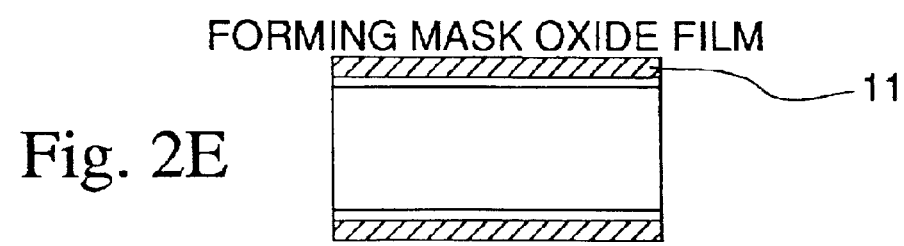
Figure 2F:
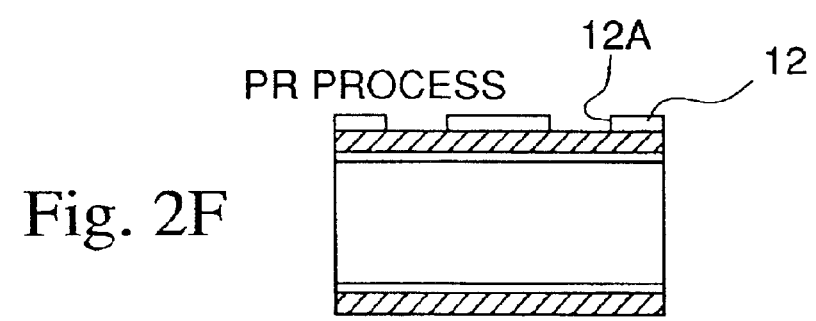

Subsequently, on the surface of the silicon wafer 10 a mask oxide film 11 having a thickness of 1 μm, for example, is formed (FIG. 2(E)). Instead of this mask oxide film 11, it is possible to grow a nitride film ($SiN_x$) by CVD reactions.

Next, using well-known photolithography techniques, the mask oxide film 11 is covered with a photoresist 12. Additionally, on this photoresist, a window 12a with a specified dopant is formed.

Figure 3A:
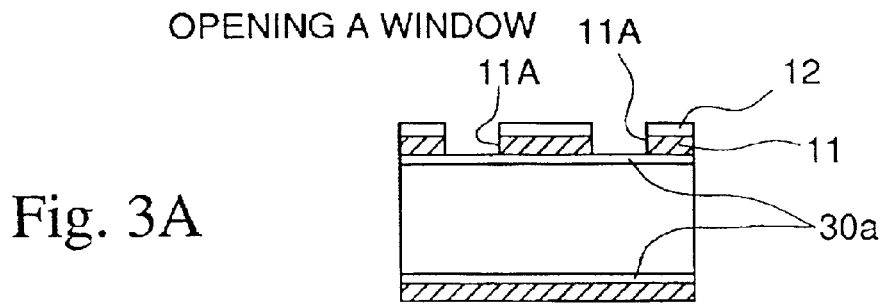
FIGS. 3A to 3F are cross-sectional drawings for explaining a part of the fabrication process of the dielectrically separated wafer according to the first embodiment of this invention.

Then through this window 12a, a window 11A having the same pattern is formed in the oxide film 11, and a part of the surface of the silicon wafer 10 is exposed (FIG. 3(A)).

Figure 3B:
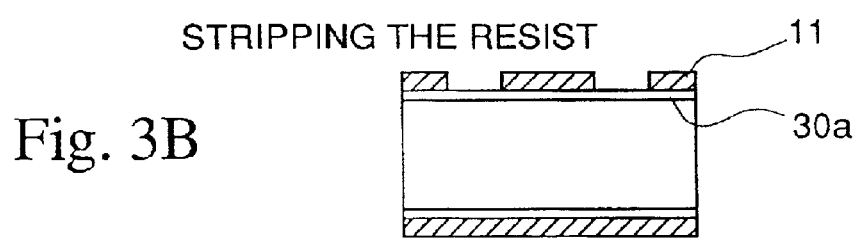
Figure 3C:
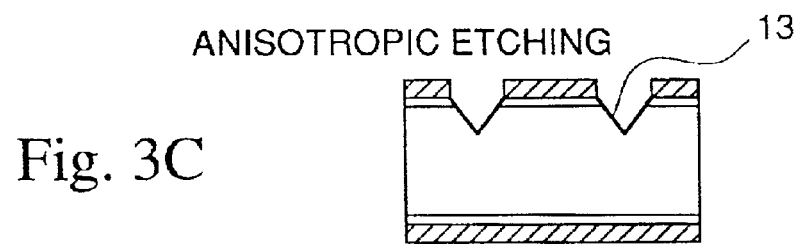

Next, the photoresist 12 is removed (FIG. 3(B)). Additionally, the surface of this wafer is cleaned.

Furthermore, with this oxide film 11 serving as a mask, this silicon wafer 10 is immersed in an anisotropic etchant (IPA/KOH/H$_2$O) for a specified time. As a result, on the surface of the silicon wafer, a concavity (pit) having a specified pattern is formed. That is, anisotropic etching is carried out on the wafer surface, and dielectrically separating grooves having a V-shaped cross-section are formed (FIG. 3(C)). At this time, the dielectrically separating grooves 13 partitions the high concentration impurity layer 30a of the surface of the silicon wafer 10 into many parts, and in addition, the bottom of each dielectrically separating groove 13 is disposed on the lower surface of the high concentration impurity layer 30a, and reaches a part of the silicon wafer 10 that includes the low concentration impurity.

Figure 3D:
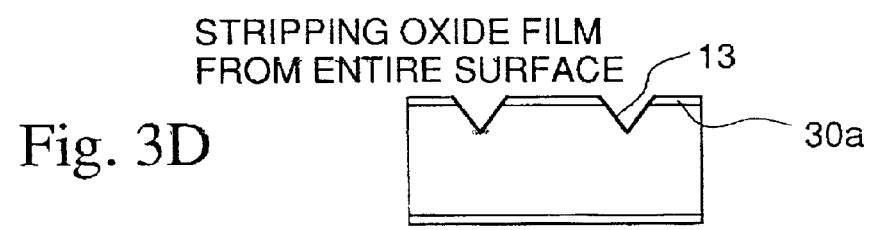

Subsequently, the mask oxide film 11 is cleaned and removed by a dilute HF solution (FIG. 3(D)).

Figure 3E:
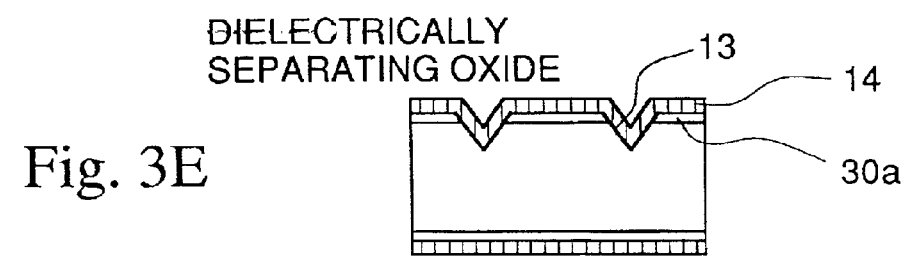
Figure 3F:
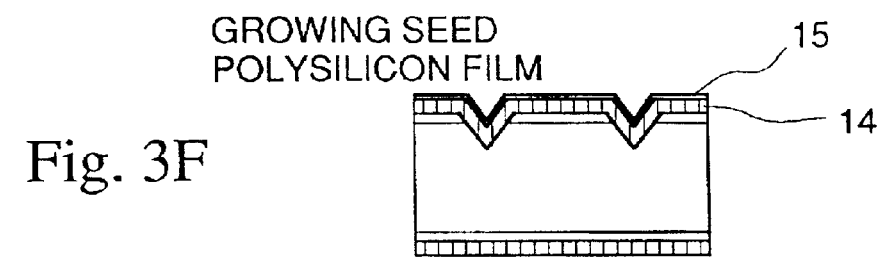

Next, on the surface of the wafer (including the undersurface), by thermal oxide processing a dielectrically separating oxide film 14 is formed (FIG. 3(E)).

At this time, on the surface of the dielectrically separating grooves 13 as well, a dielectrically separating oxide film 14 is formed. Additionally, the surface of the wafer is cleaned.

Next, on the surface of this silicon wafer 10, that is, the dielectrically separating oxide film 14 of the surface, is covered at a specific thickness with a seed polysilicon layer 15 (FIG. 3 (F)). After covering, this surface is cleaned.

Next, by a high temperature CVD method at about 1200°~1300° C., on the surface of this seed polysilicon layer 15, a thigh temperature polysilicon layer 16 is thickly formed (FIG. 4(A)). Thereafter, the peripheral portion of the wafer is chamfered and as necessary the undersurface of the wafer is flattened.

Next, the high temperature polysilicon layer 16 of the wafer surface is ground and polished to a thickness of about 10~80 μm. In addition, subsequently, a low temperature polysilicon layer 17 having a thickness of 1~5 μm is formed on the wafer surface by a low temperature CVD method between 550°~700° C., and then, with the object of imparting a mirror finish to the laminated surfaces, the surface of the low temperature polysilicon layer 17l is polished (FIG. 4(B)).

In the meantime, the mirror surface of the silicon wafer 20, which will serve as the support substrate wafer, is prepared. Next, the mirror surfaces of the active layer of the silicon wafer 10 and the silicon wafer 20 are brought into contact and laminated (FIG. 4(D)). Then the lamination strength of the laminated wafers is increased by heat processing.

Next, as shown in FIG. 4(E), the peripheral portion of the active layer of the wafer is chamfered, and the active layer of the wafer surface is ground and polished. Moreover, the active surface of the wafer is ground until the dielectrically separating oxide film 14 is exposed to the outside, and dielectrically separated islands 30 defined by the dielectrically separating oxide film 14 are realized on the surface of the high temperature polysilicon layer 16.

The fabricated dielectrically separated islands 30 are silicon islands laminated on the high concentration impurity layer formed on the bottom of the islands, on which the low concentration impurity layer 30b including a dopant (phosphorus) of the same conductivity (N-type) as this layer 30a (refer to FIG. 1).

Thereby, during device manufacture, when the surface of the dielectrically separated silicon islands 30 are patterned, it is not necessary to have the conventional masking to avoid the exposed areas of the high concentration impurity layer. As a result, it is possible to enlarge the fabrication surface area of the device at the dielectrically separated silicon islands 30, and thus, it is possible to implement effective use of the dielectrically separated wafer.

Moreover, the case of doping phosphorus P on an N-type silicon wafer was explained, but the case of doping with antimony Sb uses Sb2O3 as a gas, has a diffusion temperature of 1200°~1250° C., and has a specific resistance ρs of 10~30Ω/.

In addition, in the case of a P on P$^+$ structure, for example, BBr3 is used, the diffusion temperature is 700°~1200° C., and the specific resistance is 5~20Ω/. Both have a thickness of 1~5 μm. The specific resistance can be measured by a probe after removing the oxide film 4, the thickness can be measured by an optical microscope after bore wrapping and staining the etching.

FIG. 5 shows the case wherein ion impregnation is used in the formation of the high concentration layer. This figure shows only the step that replaces the thermal diffusion method (FIG. 2).

Figure 5A:
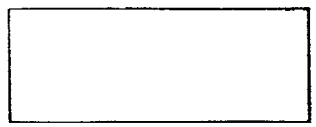
FIGS. 5A to 5F are cross-sectional drawings for explaining a part of the fabrication process of the dielectrically separated wafer according to another embodiment of this invention.
Figure 5B:
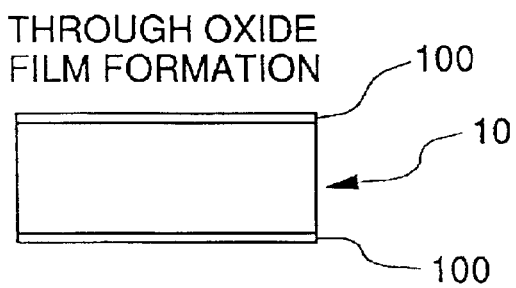

That is, first, a through oxide film 101 is formed on the surface of the cleaned and polished silicon wafer 10 (FIG. 5(B)). It has a thickness of 10~20 nm.

Figure 5C:
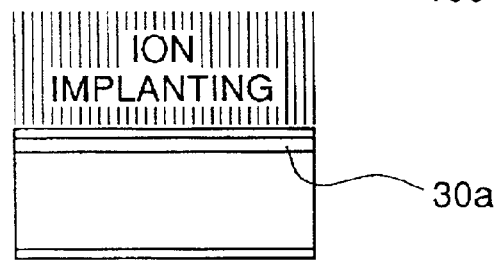
Figure 5D:

In addition, in the case of an N-type, As, Sb, P, and in the case of a P-type B (B$_2$H$_6$) are ion implanted by a specified high voltage (FIG. 5(C)). The concentrations are: arsenic, $10^{15}$~$10^{17}$ cm$^{-2}$ at 20~200 keV; antimony and phosphorus, $10^{13}$~$10^{15}$ cm$^2$ at 20~200 keV; and boron, $10^{12}$~$10^{14}$ cm$^{-2}$ at 20~200 keV. As a result, a specified dopant is implanted in a range of specified depth below the surface of the silicon wafer. This becomes the high concentration layer 30a.

Next, the surface oxide film is removed with a dilute HF solution, etc. (FIG. 5(D)).

Figure 5E:
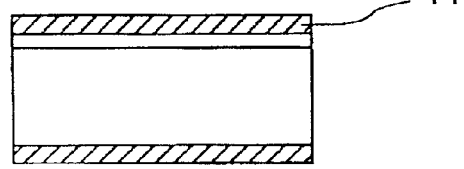
Figure 5F:
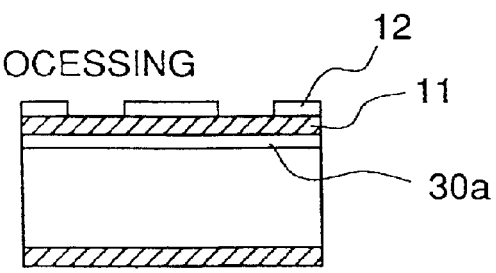

Further, a mask oxide film 11 having a thickness, for example, of 1 μm is formed by thermal oxidation on the surface of the silicon wafer 10 (FIG. 5(E)).

Subsequently, patterning of the mask oxide film 11 is carried out by the photo resist 12 in the photolithography step, and like the above first embodiment, V-shaped grooves are formed. The subsequent steps are the same as the first embodiment, and their explanation is omitted.

According to this invention, because the silicon islands are dielectrically separated silicon islands in which a low concentration impurity layer including dopant of the same conductivity as the high concentration layer is laminated on the high concentration impurity layer formed at the bottom of the islands, it is possible to expand the fabrication surface area of the dielectrically separated silicon islands.

Second Embodiment

Below, the dielectrically separated wafer and a fabrication method for the same according to the present invention will be explained. Moreover, here, the laminated dielectrically separated wafer explained in the Description of the Related Art will be explained as an example. Therefore, the same parts are denoted by the same reference numerals.

Figure 6:
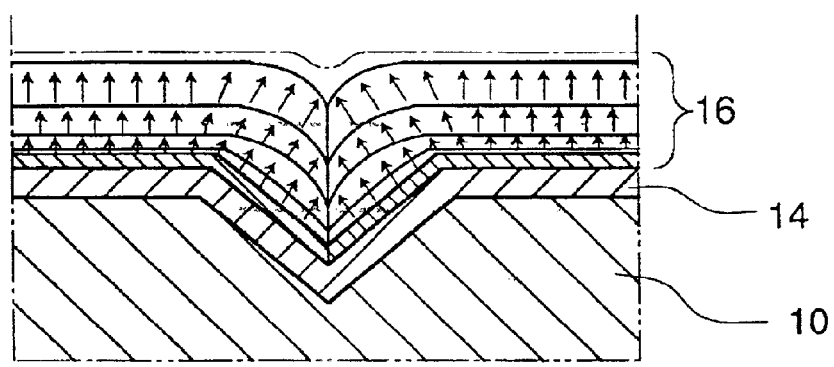
FIG. 6 is an explanatory drawing showing the growth process of the high temperature polysilicon layer on the seed polysilicon layer according to the embodiment of the present invention.

FIG. 6 is an explanatory drawing showing the growth process of the high temperature polysilicon layer on the seed polysilicon layer according to one embodiment of the present invention. FIG. 2 is an explanatory figure showing the fabrication process of the dielectrically separated wafer according to one embodiment of the present invention.

First, a silicon wafer 10 having the surface that will serve as the active surface of the wafer is fabricated and prepared (FIG. 7(a)).

Next, after this silicon wafer is cleaned, a mask oxide film 11 is formed on the wafer surface (FIG. 7(b)). Moreover, instead of the mask oxide film 11, a nitride film can be grown by the CVD method.

Next, a resist film 12 is attached to this mask oxide film 11. In addition, the window of a specified pattern is formed on this resist film 12.

Next, via this window, a window with the same pattern is formed on the oxide film 11, and a part of the surface of the silicon wafer 10 is exposed.

Next, the resist film 12 is removed, and the surface of the wafer is cleaned.

Furthermore, this silicon wafer is immersed on an anisotropic etchant (IPA/KOH/H2O) for a specified period of time. As a result, on the silicone wafer surface, concavities having a specified pattern are formed on the silicon wafer surface. Thus, anisotropic etching is carried out on the wafer surface, and dielectrically separating grooves 13 having a V-shaped cross-section are formed (FIG. 7(c)).

Next, the mask oxide film 11 is removed (FIG. 7(d)).

Subsequently, according to necessity, a dopant is implanted in the silicon, and then on the surface of the wafer, a dielectrically separating oxide film 14 is formed by oxidizing thermal processing (FIG. 7(e)). As a result, the dielectrically separating oxide film 14 is formed also on the dielectrically separating grooves 13.

Then the surface of this wafer is cleaned.

Next, on the surface of the dielectrically separating oxide film 14, by a low pressure, low temperature CVD method, in which the pressure is 130 Pa, the source gas is SiH4 and the temperature is 600° C., a 500 nm seed polysilicon layer 15 is grown. In addition, after cleaning, on this seed polysilicon layer 15, a 150 μm high temperature polysilicon layer 16 is grown using a high temperature CVD method at approximately 1200° C. (FIG. 7(f)).

The growth by the low temperature CVD method exhibits good coating characteristics on a foreign object because the particle radius of the crystals of the polysilicon are is small. Due to this, even if there are defects on the surface of the dielectrically separating oxide film 14, the growing seed polysilicon gradually coats them. Therefore, the surface of the seed polysilicon layer 15 has a high degree of smoothness.

Thus, subsequently, when growing polysilicon on this very smooth seed polysilicon layer 15 by the high temperature CVF method, over the entire surface of the dielectrically separating oxide film 14 polysilicon can be grown maintaining a uniform thickness (refer to FIG. 6). As a result, it is possible to eliminate voids produced between the dielectrically separating oxide film 14 and the polysilicon layer.

Thereby, after fabricating the dielectrically separating wafer, the concavities on the surface of the high temperature polysilicon layer 16 exposed on the wafer surface are eliminated.

Then the peripheral portion of the wafer is chamfered, and according to necessity, the undersurface of the wafer is flattened. Next, the high temperature polysilicon layer 16 is ground to a thickness of about 30 μm, and polished.

Subsequently, because a low temperature polysilicon layer 17 having a thickness of about 3.0 μm is grown by the low temperature CVD method at about 600° C. on the wafer surface, in order to mirror polish the surfaces for lamination, the surface of the low temperature polysilicon layer 17 is polished.

In the meantime, the mirror surface of the silicon wafer 20 (here, covered by the silicon oxide layer 21), which will serve as the support substrate wafer, is prepared.

Next, the mirror surfaces of the active layer of the silicon wafer 10 and the silicon wafer 20 are brought into contact and laminated (FIG. 7(i)).

Additionally, the lamination strength of the laminated wafers is increased by annealing.

Next, as shown in FIG. 7(j), the peripheral portion of the active layer of the wafer is chamfered, after removing the oxide layer 21 from the silicon wafer 20 which will serve as the support substrate and cleaning it, the silicon wafer 10 is ground and polished. Moreover, the active surface of the wafer is ground until the dielectrically separating oxide film 14 is exposed to the outside, and dielectrically separated islands 19A defined by the dielectrically separating oxide film 14 are realized on the surface of the high temperature polysilicon layer 16, and neighboring silicon islands are completely separated from each other.

In this manner, the laminated dielectrically separated wafers are fabricated.

Here, in fact, when carrying out a experiments to contrast the conventional method (interposing no seed polysilicon layer) and the present invention (interposing a seed polysilicon layer), the number of generated voids appearing on the surface of each silicon wafer 10 is recorded. Moreover, this experiment for both the conventional method and the method of the invention were carried out twice using one group of 10 silicon wafers for each.

Figure 8:
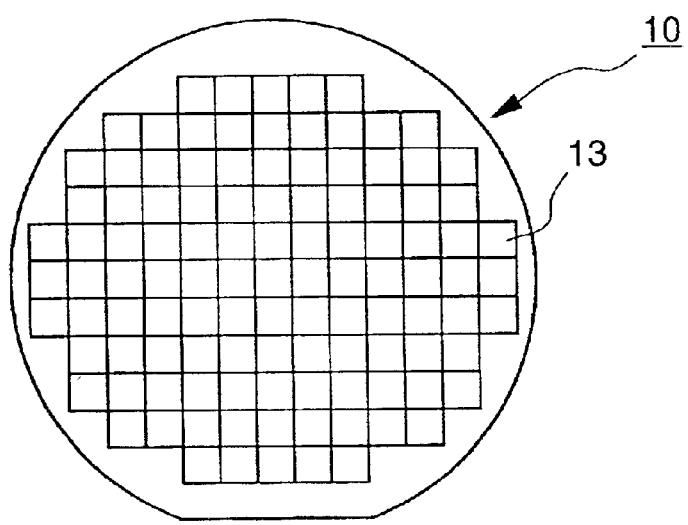
FIG. 8 is an explanatory drawing showing the pattern of the anisotropic etching over the entire surface of the silicon wafer.

A dielectrically separating oxide film of only 1 μm is formed in advance on the surface of a 5-inch diameter, 625 μm thick silicon wafer 10 having dielectrically separating grooves with a depth of 60 μm. Subsequently, on the surface of the silicon wafer 10, a high temperature polysilicon layer is grown under the following conditions. FIG. 8 shows the pattern areas of the anisotropic etching in each location on the surface of the silicon wafer 10. The voids are observed in these regions.

Figure 9:
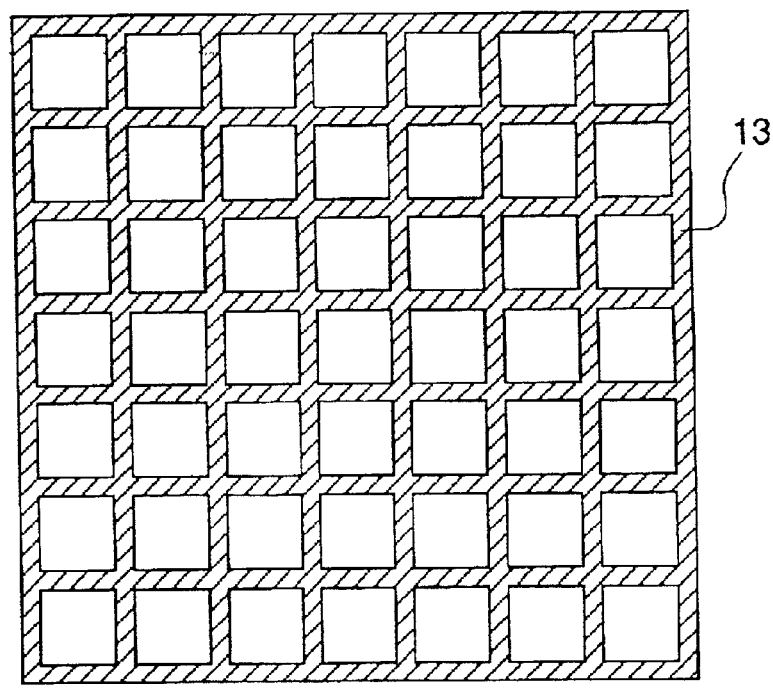
FIG. 9 is an explanatory drawing showing the pattern of the anisotropic etching over one part of the surface of the silicon wafer.
Figure 10:
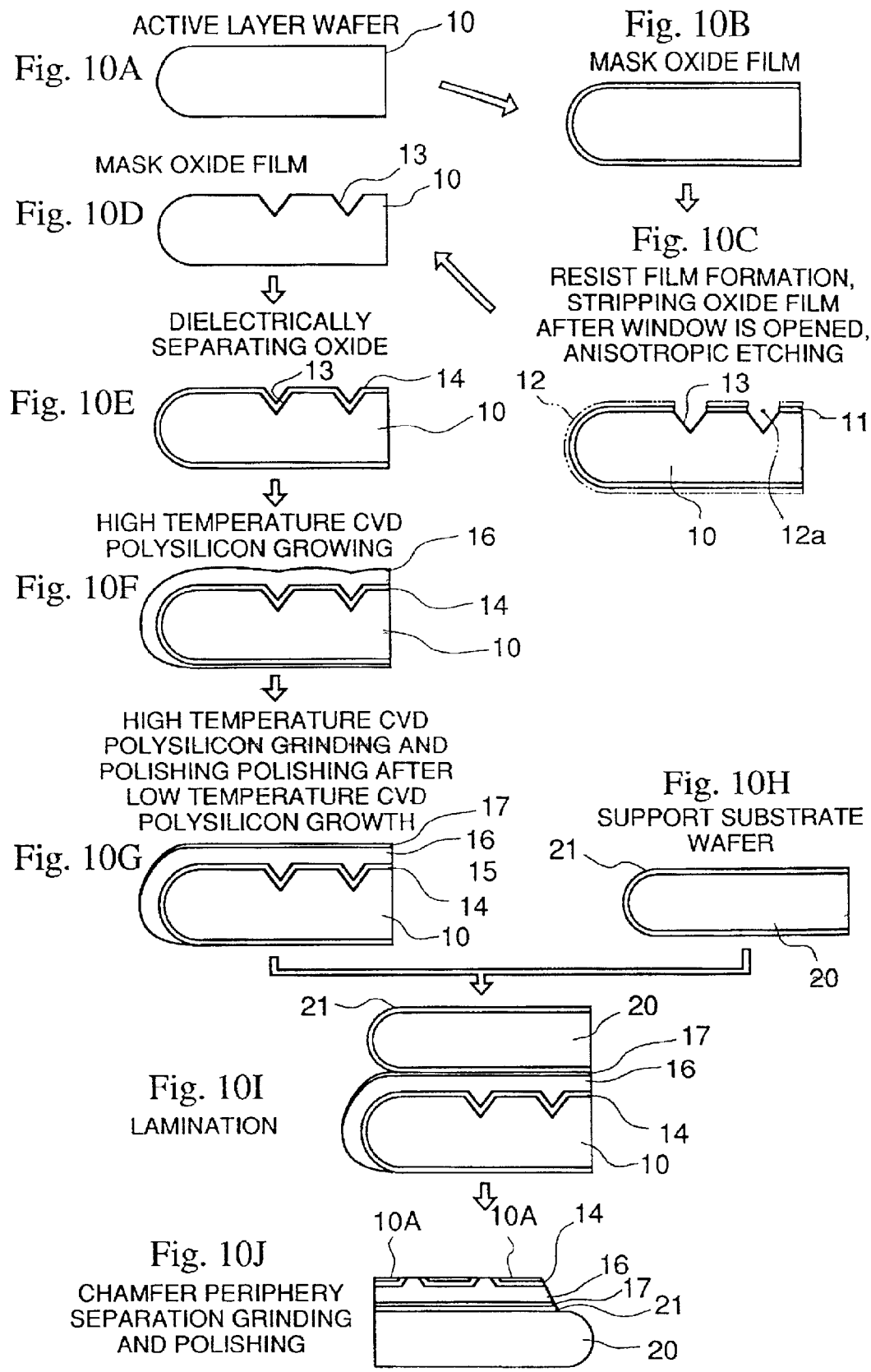
FIGS. 10A to 10J are explanatory drawings showing the fabrication process of the dielectrically separated wafer according to one embodiment of the present invention.
Figure 11:
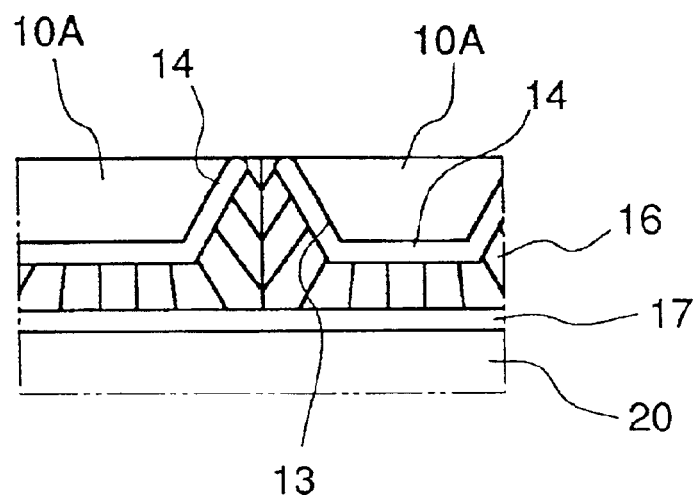
FIG. 11 is an enlarged cross-section of necessary parts of the dielectrically separated wafer according to one embodiment of the present invention.

The overall dimensions for each part are 8600×8600 μm. Among these, 49 patterns (one pattern is 1100×1100 μm) are formed (refer to FIG. 9). The groove width of the anisotropic etching is 100 μm. However, the groove width at only the peripheral edge of the pattern as a whole is set to 150 μm. Moreover, FIG. 4 is an explanatory drawing showing the pattern of anisotropic etching in one part of the surface of the silicon wafer.

The growth conditions for the high temperature polysilicon layer are: thickness, 150 μm; source gas (TCS (trichloralsilane)); growth temperature, 1200° C. In addition, the growth conditions for the seed polysilicon layer of the present invention by the low pressure, low temperature CVD method are: thickness, 500 μm; source gas, SiH$_4$; growth temperature, 600° C.; and pressure 130 Pa.

Subsequently, after the primary grinding of the surface of the high temperature polysilicon layer by a vitrified grinding stone with a #300 abrasive grain, finishing grinding is carried out by a vitrified finishing grinding stone having a #500 abrasive grain, and is ground 100 μm altogether. Next, after polishing this ground surface by only 20 μm, the number of produces voids appearing over the whole ground surface of the ten silicon wafers 10 are scanned over the entire surface under fluorescent light with an optical microscope. The results of these measurements are shown in Table 1.

TABLE 1

|  | Conventional method | | Present invention | |
| --- | --- | --- | --- | --- |
|  | First time (locations/wafer) | Second time (locations/wafer) | First time (locations/wafer) | Second time (locations/wafer) |
| Wafer 1 | 25 | 22 | 0 | 0 |
| Wafer 2 | 8 | 18 | 0 | 0 |

TABLE 1-continued

|  | Conventional method | | Present invention | |
| --- | --- | --- | --- | --- |
|  | First time (locations/ wafer) | Second time (locations/ wafer) | First time (locations/ wafer) | Second time (locations/ wafer) |
| Wafer 3 | 13 | 41 | 0 | 0 |
| Wafer 4 | 32 | 17 | 0 | 0 |
| Wafer 5 | 7 | 9 | 0 | 0 |
| Wafer 6 | 11 | 22 | 0 | 0 |
| Wafer 7 | 15 | 8 | 0 | 0 |
| Wafer 8 | 34 | 27 | 0 | 0 |
| Wafer 9 | 6 | 5 | 0 | 0 |
| Wafer 10 | 16 | 10 | 0 | 0 |
| Average value | 16.7 | 17.9 | 0 | 0 |

As is clear form Table 1, without interposing the seed polysilicon layer, directly with the conventional method of growing a high temperature polysilicon layer, there were an average of 16.7 voids produced per one wafer in the first experimental time. In addition, during the second time, almost the same average, 17.9, voids were produced. In contrast, in the present invention having a seed polysilicon layer interposed, there were no voids produced in wither the first or second experiments.

According to the present embodiment, because a seed polysilicon layer made by a low temperature CVD method is interposed, and a polysilicon layer is grown when growing a polysilicon layer on a dielectrically separating oxide film, the concavities in the exposed surface of the polysilicon layer and the generation of gaps produced at the interface between the polysilicon layer and the dielectrically separating oxide film are suppressed.

Third Embodiment

Below, a dielectrically separated wafer and a fabrication method for the same according to embodiments of the present invention are explained. Moreover, this is explained using as an example the laminated dielectrically separated wafer described the Description of the Related Art, and therefore the same reference numerals as those of FIG. 7 denote the same corresponding parts.

First, a silicon wafer 10 having the surface that will serve as the active surface of the wafer is fabricated and prepared (FIG. 7(a)).

Next, a mask oxide film 11 is formed on the surface of the silicon wafer 10 (FIG. 7(b)).

A Next, a resist film 12 is attached to this mask oxide film 11. In addition, the windows of a specified pattern is formed on this resist film 12.

Next, via this windows, windows with the same pattern is formed on the oxide film 11, and a part of the surface of the silicon wafer 10 is exposed.

Next, the resist film 12 is removed.

Furthermore, this silicon wafer is immersed on an anisotropic etchant (IPA/KOH/H2O) for a specified period of time. As a result, on the silicone wafer surface, concavities having a specified pattern are formed on the surface of the silicon wafer 10. Thus, anisotropic etching is carried out on the wafer surface, and dielectrically separating grooves 13 having a V-shaped cross-section are formed (FIG. 7(c)).

Next, the mask oxide film 11 is cleaned and removed using a diluted HF solution, for example, by immersion (FIG. 7(d)).

Subsequently, a dielectrically separating oxide film 14 is formed by oxidizing thermal processing to a thickness of 1~3 $\mu$m (FIG. 7(e)).

Then, the surface of this wafer 10 is cleaned with purified water.

Next, a high temperature polysilicon layer 16 is grown to a specified thickness by the high temperature CVD method on the surface of the silicon wafer 10 (FIG. 7(f)). Moreover, during the growth of the polysilicon layer, the source gas is trichlorosilane or silicon tetrachloride.

Next, the peripheral area is chamfered, and according to necessity, the underside of the wafer is flattened.

Next, the high temperature polysilicon layer 16 of the wafer surface is ground and polished up to a thickness of 30 $\mu$m. In addition, subsequently, according to necessity, a low temperature polysilicon layer 17 having a thickness of 3 $\mu$m is deposited on the wafer surface by thaw temperature CVD method at 600° C., and this surface is polished (FIG. 7(g)).

Meanwhile, a silicon wafer 20 that will serve as the support substrate is prepared (FIG. 7(h)).

Next, the mirror surfaces of this silicon wafer 20 and the silicon wafer 10 that is to serve as the active layer are layered and laminated (FIG. 7(i)).

Additionally, a specified laminating thermal processing is carried out on this laminated wafer 30.

Next, as shown in FIG. 7(j), the peripheral portion of the side of the wafer serving at the active surface is chamfered, and the wafer surface serving as the active layer is ground and polished. Here, it is possible to use as an abrasive, for example, an alkaline etchant adding to 2~5 wt. % an abrasive grain with average particle diameters of about 20~100 nm. In addition, the polishing temperature is 20~35° C. and the polishing time is 5~10 min.

Figure 13:
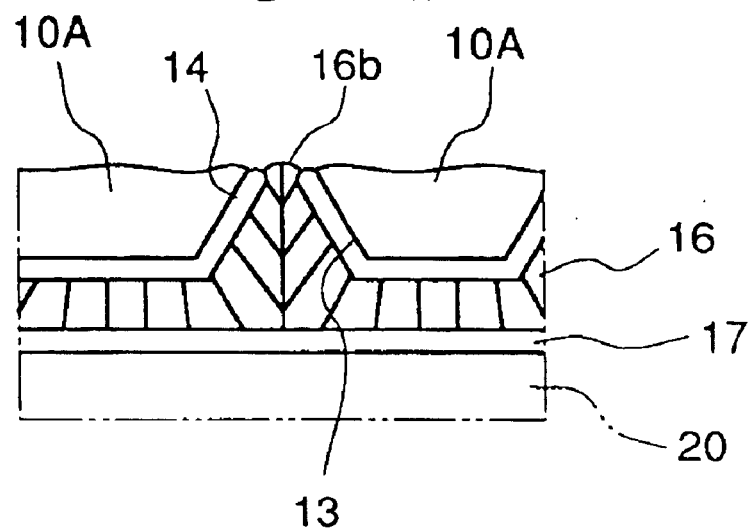
FIG. 13 is an enlarged cross-section of necessary parts of the dielectrically separated wafer fabricated by minimizing the amount of polishing according to the conventional means.
Figure 14:
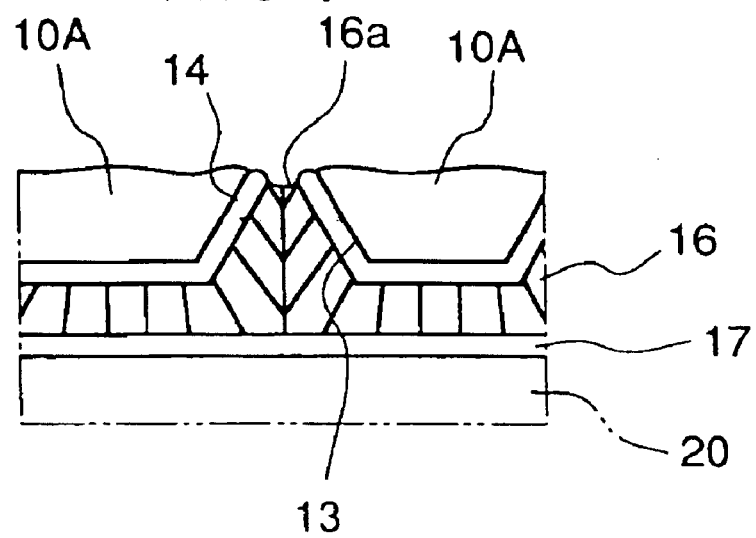
FIG. 14 is an enlarged cross-section of necessary parts of the dielectrically separated wafer fabricated by maximizing the amount of polishing according to the conventional means.
Figure 15:
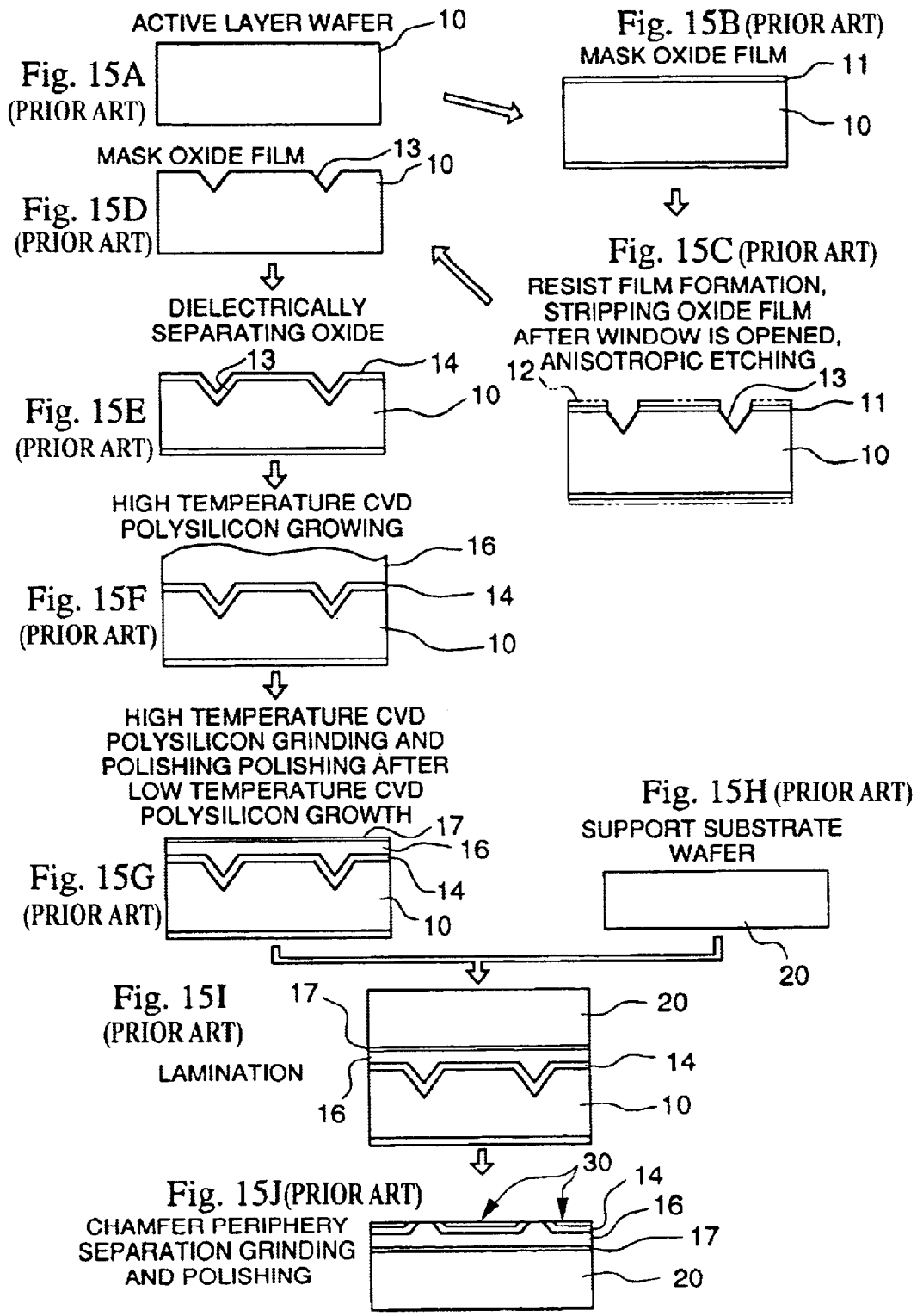
FIGS. 15A to 15J are cross-sectional drawings for explaining the fabrication steps according to the conventional dielectrically separated wafer fabrication process.
Figure 16:
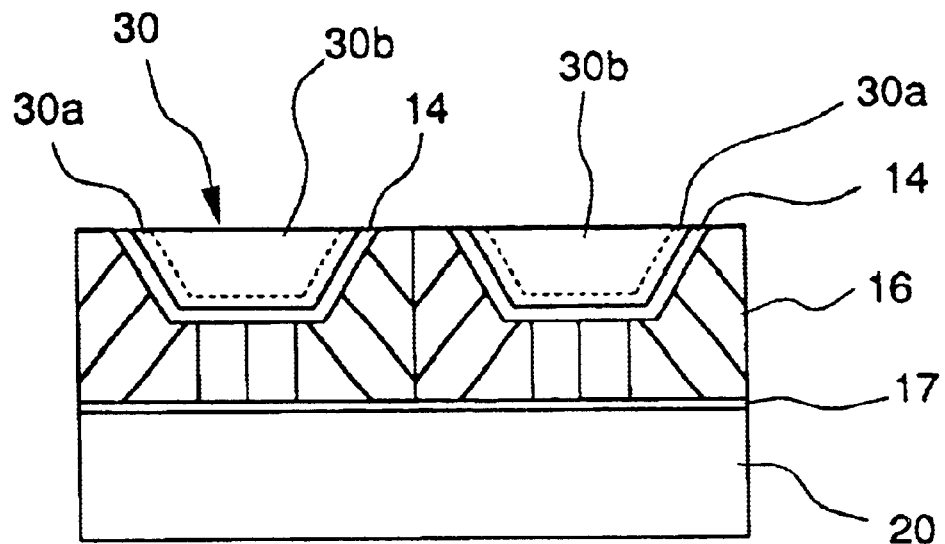
FIG. 16 is an enlarged cross-sectional drawing of the necessary parts of the conventional dielectrically separated wafer.
Figure 17:
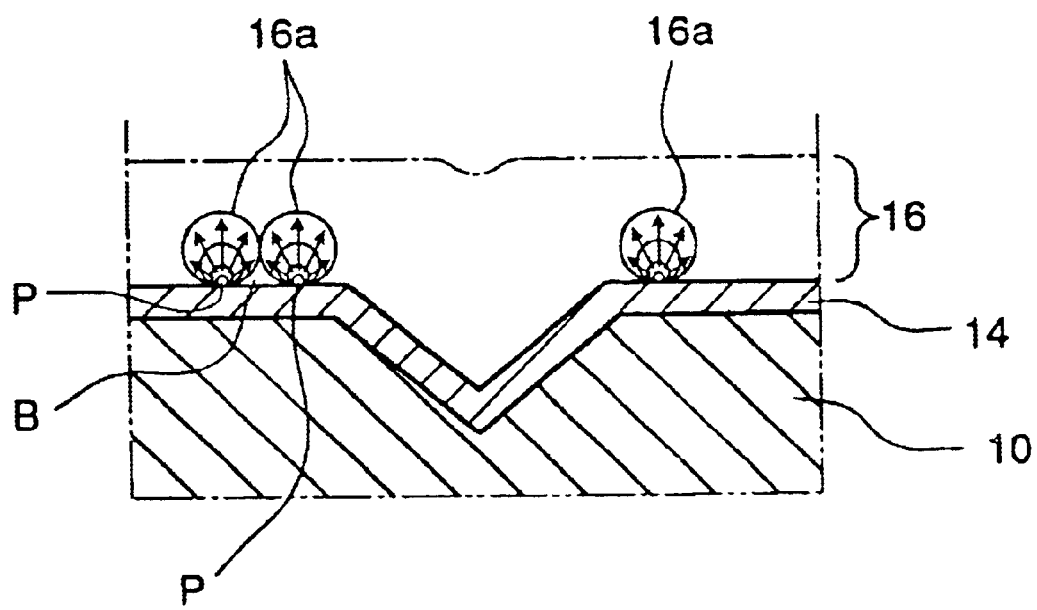
FIG. 17 is an explanatory drawing showing the growth process of the polysilicon layer according to the conventional means.

The amount of grinding of the wafer having the active surface, as shown in FIG. 2, is sufficient to realize the dielectrically separates silicon islands 10A insulated by the dielectrically separating oxide film 14, and to obtain a flatness of the surface between one dielectrically separated silicon island and a neighboring dielectrically separated silicon island below 0.2 $\mu$m, which is the absolute value of the difference between the maximum value and the minimum value when measured using a stylus-profilometer. Therefore, on the surface between the dielectrically separated silicon islands 10A, there is almost no formation of protrusions 16b (refer to FIG. 13) or indentations 16a (refer to FIG. 14).

Moreover, as a specific example, (1) under the conditions that the amount of polishing L1 (refer to FIG. 3)=8~15 $\mu$m, the thickness of the dielectrically separating oxide film= 0.2~1.3 $\mu$m, and the distance W between the dielectrically separated silicon islands 10A is 11~21 $\mu$m, the flatness of the wafer surface will be increased. That is, the above-mentioned absolute value will be below 0.2 $\mu$m.

In addition, (2) under the conditions that the amount of polishing L1 (refer to FIG. 3)=15~25 $\mu$m, the thickness of the dielectrically separating oxide film=1.3~2.0 $\mu$m, and the distance W between the dielectrically separated silicon islands 10A is 21~35 $\mu$m, similarly, the flatness of the wafer surface will be increased.

Figure 12:
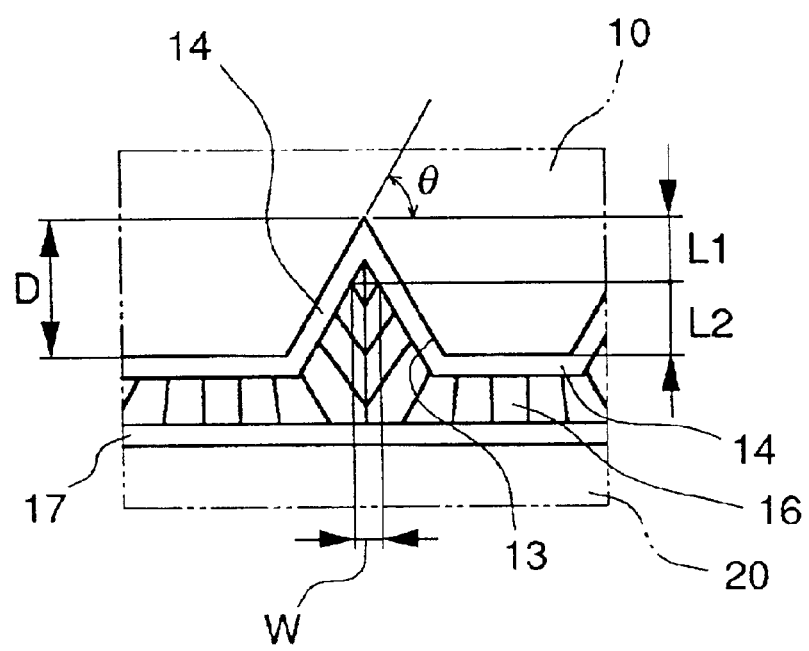
FIG. 12 is an explanatory drawing showing the relationship between the amount of polishing of the surface of the dielectrically separated wafer and the distance between dielectrically separated silicon islands.

Furthermore, (3) under the conditions that the amount of polishing L1 (refer to FIG. 12)=25~40 $\mu$m, the thickness of the dielectrically separating oxide film=2.0~3.0 $\mu$m, and the distance W between the dielectrically separated silicon islands 10A is 35~57 $\mu$m, the flatness of the wafer surface will be increased.

As a result, in comparison with the conventional dielectrically separated wafer on which indentations 16a are formed between the dielectrically separated silicon islands 10A, it is possible to realize dielectrically separated silicon islands 10A having a comparatively large surface area. Furthermore, at the same time, it is possible, for example, to prevent damage to the resist film that covers the wafer surface during contact exposure in the device fabrication process and prevent contamination from remaining in the vicinity of protrusions 16b after the wafer is cleaned, which is caused by generation of these projections 16b.

At the same time, it is also possible, for example, to realize the uniform application of the resist on the wafer surface in the photolithography processing while fabricating devices, to prevent deterioration of the resolution during exposure in this process, to prevent resist film from remaining during cleaning after the exposure, and to prevent completely the indentations 16a from becoming sites in which contamination can adhere in each type of process.

Subsequently, actually the flatness of the surface of the side of the wafer that serves as the active layer of this dielectrically separated wafer was measured by a stylus-profilometer along with comparative examples. The results of these measurements are presented along with the comparative examples.

EXAMPLES 1~4, COMPARATIVE EXAMPLES 1, 2

Using an abrasive having $SiO_2$ as the primary ingredient of the abrasive grain, a concentration of grain at 2~5 wt. %, and a pH of 10±1.0, under the polishing conditions shown in Table 2, the surface on which the polysilicon layer of the side of the wafer that will serve as the active surface and the surface of the opposite side were polished. Thereby, a plurality of dielectrically separated silicon islands were formed by separation.

Next, using a stylus-profilometer (manufactured by WYKO Co., model TOPO-3D), the steps in the surface between the dielectrically separated silicon islands on the wafer serving as the active layer were measured. Here, the difference between the maximum value and the minimum value are show in also in Table 2.

TABLE 2

| | Amount of polishing L1 (μm) | Thickness of dielectrically separating oxide film (μm) | Step measurement value (μm) |
|---|---|---|---|
| Example 1 | 8 | 0.8 | −0.8 |
| Example 2 | 8 | 1.3 | +0.17 |
| Example 3 | 14 | 0.8 | −0.18 |
| Example 4 | 14 | 1.3 | +0.06 |
| Comparative Example 1 | 9 | 1.5 | +0.33 |
| Comparative Example 2 | 12 | 1.5 | +0.26 |

As is clear from Table 2, under the polishing conditions of examples 1 through 4, having a polishing amount L1 (refer to FIG. 3) of 8 μm or 14 μm, and a dielectrically separating oxide film thickness of 0.8 μm and 1.3 μm, the step measurement value was within the target value ±0.2 μm. In contrast, in the case that the amount of polishing L1 was 9 μm or 12 μm, and the dielectrically separating oxide films were both 1.5 μm, the step measurement value exceeded ±0.2 μm.

EXAMPLES 5~8, COMPARATIVE EXAMPLES 3, 4

Using the same abrasive as the first embodiment, under the polishing conditions shown in Table 2, the surface on which the polysilicon layer of the side of the wafer that will serve as the active surface and the surface of the opposite side were polished. Thereby, a plurality of dielectrically separated silicon islands were formed by separation.

Next, using the same stylus-profilometer, the steps in the surface between the dielectrically separated silicon islands on the wafer serving as the active layer were measured. Here, the difference between the maximum value and the minimum value are show in also in Table 3.

TABLE 3

| | Amount of polishing L1 (μm) | Thickness of dielectrically separating oxide film (μm) | Step measurement value (μm) |
|---|---|---|---|
| Example 5 | 15 | 1.4 | +0.04 |
| Example 6 | 15 | 2.0 | +0.18 |
| Example 7 | 24 | 1.4 | −0.17 |
| Example 8 | 24 | 2.0 | +0.02 |
| Comparative example 3 | 18 | 1.0 | +0.36 |
| Comparative example 4 | 20 | 2.3 | +0.34 |

As is clear from Table 3, under the polishing conditions of examples 5 through 8, having a polishing amount L1 (refer to FIG. 12) of 15 μm or 24 μm, and a dielectrically separating oxide film thickness of 1,4 μm and 2.0 μm, the step measurement value was within the target value ±0.2 μm. In contrast, in the case that the amount of polishing L1 was 18 μm or 20 μm, and the dielectrically separating oxide films were 1.0 μm or 2.3 μm, the step measurement value exceeded ±0.2 μm.

EXAMPLES 9~12, COMPARATIVE EXAMPLES 5, 6

Using the same abrasive as the first example, under the polishing conditions shown in Table 4, the surface on which the polysilicon layer of the side of the wafer that will serve as the active surface and the surface of the opposite side were polished. Thereby, a plurality of dielectrically separated silicon islands were formed by separation.

Next, using the same stylus-profilometer, the steps in the surface between the dielectrically separated silicon islands on the wafer serving as the active layer were measured. Here, the difference between the maximum value and the minimum value are show in also in Table 4.

TABLE 4

| | Amount of polishing L1 (μm) | Thickness of dielectrically separating oxide film (μm) | Step measurement value (μm) |
|---|---|---|---|
| Example 9 | 25 | 2.1 | +0.03 |
| Example 10 | 25 | 2.8 | +0.19 |
| Example 11 | 39 | 2.1 | −0.17 |
| Example 12 | 39 | 2.8 | +0.04 |
| Comparative Example 5 | 35 | 1.8 | +0.25 |

TABLE 4-continued

|  | Amount of polishing L1 ($\mu$m) | Thickness of dielectrically separating oxide film ($\mu$m) | Step measurement value ($\mu$m) |
| --- | --- | --- | --- |
| Comparative Example 6 | 35 | 3.1 | +0.44 |

As is clear from Table 4, under the polishing conditions of examples 9 through 12, having a polishing amount L1 (refer to FIG. 3) of 25 $\mu$m or 39 $\mu$m, and a dielectrically separating oxide film thickness of 2.1 $\mu$m and 2.8 $\mu$m, the step measurement value was within the target value ±0.2 $\mu$m. In contrast, in the case that the amount of polishing L1 were both 35 $\mu$m, and the dielectrically separating oxide films were 1.8 $\mu$m or 3.1 $\mu$m, the step measurement value exceeded ±0.2 $\mu$m.

According to the third embodiment of the present invention, it is possible to realize a smooth surface without projections or indentations on the surface between dielectrically separated silicon islands. Thereby, it is possible to realize dielectrically separated silicon islands which are comparatively large with respect to the wafer surface, uniformly apply to the wafer surface in each type of fabrication process for devices, prevent damage to the resist film, and prevent contamination between dielectrically separated islands and the adhering of residual resist after washing.

What is claimed is:

1. A dielectrically separated wafer having a polysilicon layer and a plurality of monocrystalline silicon islands mutually separated by a dielectrically separating layer consisting of a silicon oxide film which is formed on a surface of a polysilicon layer, wherein:

said polysilicon layer is formed by a seed low temperature CVD polysilicon layer grown by a low temperature CVD method on an interface with said dielectrically separating oxide film and a polysilicon layer formed by a high temperature CVD method; and when the surface is measured by a stylus-profilometer, a flatness of the dielectrically separated silicon wafer is less than 0.2 $\mu$m as the absolute roughness between a maximum height and a minimum height.

2. A dielectrically separated wafer having a plurality of dielectrically separated monocrystalline silicon islands mutually defined be a dielectrically separating oxide film on a surface of the wafer, wherein said dielectrically separated silicon islands comprise:

a high concentration impurity layer formed on a bottom of the islands in a flat plate form; and a low concentration impurity layer having an identical conductivity laminated on the plate of the high concentration impurity layer, wherein, when this surface is measured by a stylus-profilometer, a flatness of the dielectrically separated silicon wafer is less than 0.2 $\mu$m as the absolute roughness between a maximum height and a minimum height.

3. A dielectrically separated wafer, having a plurality of dielectrically separated monocrystalline silicon islands separated by a dielectrically separating oxide film on the wafer surface, the dielectrically separated wafer comprises a surface between one dielectrically separated silicon island and another neighboring dielectrically separated silicon island formed so as to be flat by controlling the separation polishing of monocrystalline silicon and the dielectric layer, wherein a flatness of the dielectrically separated wafer is less than 0.2 $\mu$m as the absolute roughness between a maximum height and a minimum height.

4. A dielectrically separated wafer, having a plurality of dielectrically separated monocrystalline silicon islands separated by a dielectrically separating oxide film on the wafer surface, as recited in claim 3, wherein a surface area of each of the monocrystalline silicon islands is maximized such that said monocrystal line silicon islands occupy substantially said wafer surface.

* * * * *